(12) United States Patent
Bosnyak et al.

(10) Patent No.: US 6,396,308 B1
(45) Date of Patent: May 28, 2002

(54) SENSE AMPLIFIER WITH DUAL LINEARLY WEIGHTED INPUTS AND OFFSET VOLTAGE CORRECTION

(75) Inventors: Robert J. Bosnyak, San Jose; Robert J. Drost, Mountain View, both of CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/795,281

(22) Filed: Feb. 27, 2001

(51) Int. Cl.[7] .................................................. H03F 3/45
(52) U.S. Cl. .............................. 327/51; 327/52; 327/53
(58) Field of Search .............................. 327/51, 52, 54, 327/55, 57, 71; 365/207, 149, 203

(56) References Cited

U.S. PATENT DOCUMENTS 5,065,363 A  * 11/1991 Sato et al. .................... 365/154
5,487,043 A  *  1/1996 Furutani et al. ............. 365/203
5,594,681 A  *  1/1997 Taguchi ........................ 365/149
6,134,165 A  * 10/2000 Spence ......................... 365/205
6,292,030 B1 *  9/2001 Shih .............................. 327/55

OTHER PUBLICATIONS

Yang, et al., A 0.8–μm CMOS 2.5 Gb/s Oversampling Receiver and Transmitter for Serial Links, IEEE Journal of Solid–State Circuits, vol. 31, No. 12, Dec. 1996.
Song, et al., NRZ Timing Recovery Technique for Band–Limited Channels, IEEE Journal of Solid–State Circuits, vol. 32, No. 4, Apr. 1997.

* cited by examiner

Primary Examiner—Tuan T. Lam
Assistant Examiner—Hiep Nguyen
(74) Attorney, Agent, or Firm—Townsend and Townsend and Crew LLP; William E. Winters

(57) ABSTRACT

A sense amplifier having dual differential inputs configured to accept differential analog input voltages. The differential analog input voltages are fused to determine a weighted signal digitally representative of the differential analog input voltages. An input offset voltage cancellation circuit may be coupled to the sense amplifier to reduce an input offset voltage of the sense amplifier.

19 Claims, 6 Drawing Sheets

SENSE AMPLIFIER WITH DUAL LINEARLY WEIGHTED INPUTS AND OFFSET VOLTAGE CORRECTION

BACKGROUND OF THE INVENTION

The present invention relates to amplifiers used in communication circuits. More particularly, the present invention relates to a sense amplifier with multiple linear weighted inputs, which may be used, for example, in communication systems, Providing a broadband linear weighting of two signals is an important signal processing function. In communication circuits, for example, echo cancellation, or decision feedback equalization circuits synthesize and linearly subtract a correction signal from a communication signal in order to remove noise and/or errors.

It is difficult to perform linear weighting of signals. One solution would be to use linear resistors in the form of a resistor divider to perform the weighting. Unfortunately, this method has the effect of loading the input signals with a resistive load. This is undesirable, since it could imbalance the loading and hence the responses of the signals being weighted. For example, any shared signal being weighted against a plurality of signals could not support this kind of additional loading. Other problems arise by using resistors for linear weighting. For example, for an integrated solution using CMOS digital technology, it is difficult to manufacture linear resistances that consume a small area and do not add a significant amount of parasitic capacitance to the circuit.

Another solution would be to use ratioed closed-loop amplifiers. Closed-loop amplifiers (e.g. op-amps), like the resistor divider approach, require linear resistors. So, this solution has the same drawback as the resistor divider approach. Additionally, other non-linearities attributable to, for example, offset voltages and the finite gain of the closed-loop amplifier limit the overall linearity of the circuit. Closed-loop amplifiers also have a limited frequency response, which limits the broadband performance of the circuit. For these reasons, therefore, closed loop amplifiers do not provide a desirable solution for performing weighting linearly.

Yet another solution would be to use an open-loop amplifier. However, this solution has drawbacks as well. Like the closed-loop approach, open loop amplifiers are highly non-linear at high frequencies. So, the broadband performance of such a circuit is limited. Additionally, because most active circuit elements of an open-loop amplifier are non-linear, it would be difficult to construct a linear solution.

After the signals are linearly weighted into a linearly weighted signal, the weighted signal needs to be sampled and threshold amplified to a binary digital signal. Accordingly, it would be useful from a complexity, power, and area standpoint if a circuit was provided that combines the linear weighting function described above with the sampling and threshold amplification functions. Additionally, isolation between the signals being weighted would be desirable and hence there is a need for a technique that provides isolation between the linearly weighted signal and the input signals. Finally, in order to allow the circuit to work in low cost digital CMOS technology, it would be desirable to provide a technique that compensates for the large transistor mismatches, which are sometimes seen in digital CMOS technologies.

SUMMARY OF THE INVENTION

Generally, it is an object of the present invention to provide a sense amplifier having dual differential inputs, which accept differential analog input signals that are "fused" to provide a weighted signal, which is digitally representative of the differential analog input voltages.

According to a first aspect of the invention, a sense amplifier comprises a first coupled set of n regenerative amplifiers having a first terminal and a second terminal configured to accept a first differential input signal, where n is an integer greater than or equal to one; a second coupled set of m regenerative amplifiers having a first terminal and a second terminal configured to accept a second differential input signal, where m is an integer greater than or equal to one; means for selectively coupling a power supply to the first and second sets so that the n and m regenerative amplifiers produce a first voltage (V1) across the first and second terminals of the n regenerative amplifiers and a second voltage across the m regenerative amplifiers; and a fusing circuit configured to connect the first terminal of the n regenerative amplifiers to the first terminal of the m regenerative amplifiers and to connect the second terminal of the n regenerative amplifiers to the second terminal of the m regenerative amplifiers to produce a final differential output voltage dependent upon a fusion of the first and second voltages.

In a second aspect of the invention, a sense amplifier comprises a first regenerative amplifier configured to selectively accept a first signal on a first regeneration node, a second regenerative amplifier configured to selectively accept a second signal on a second regeneration node, and a fusing circuit selectively coupled to the first and second regeneration amplifiers. The fusing circuit is operable to connect the first regeneration node to the second regeneration node, when the fusing circuit is coupled, to produce a final voltage.

In a third aspect of the invention, a sense amplifier comprises a first plurality of sense amplifier blocks, which are configured to accept a plurality of differential input signals, and a fusing circuit that is selectively coupled to the plurality of sense amplifier blocks. The fusing circuit is operable to fuse two or more of the plurality of differential input signals and provide a weighted output signal that is digitally representative of the two or more of the plurality of differential input signals.

In a fourth aspect of the invention, an input offset voltage cancellation circuit for controlling an input offset voltage at an input of an amplifier comprises a coupling capacitor having a first terminal coupled to an input of an amplifier and a second terminal selectively coupled to an electrical signal having at least one voltage transition, which produces a change in an offset voltage at the input of the amplifier.

A further understanding of the nature and advantages of the inventions herein may be realized by reference to the remaining portions of the specification and the attached drawings.

DESCRIPTION OF THE SPECIFIC EMBODIMENTS

Figure 1:
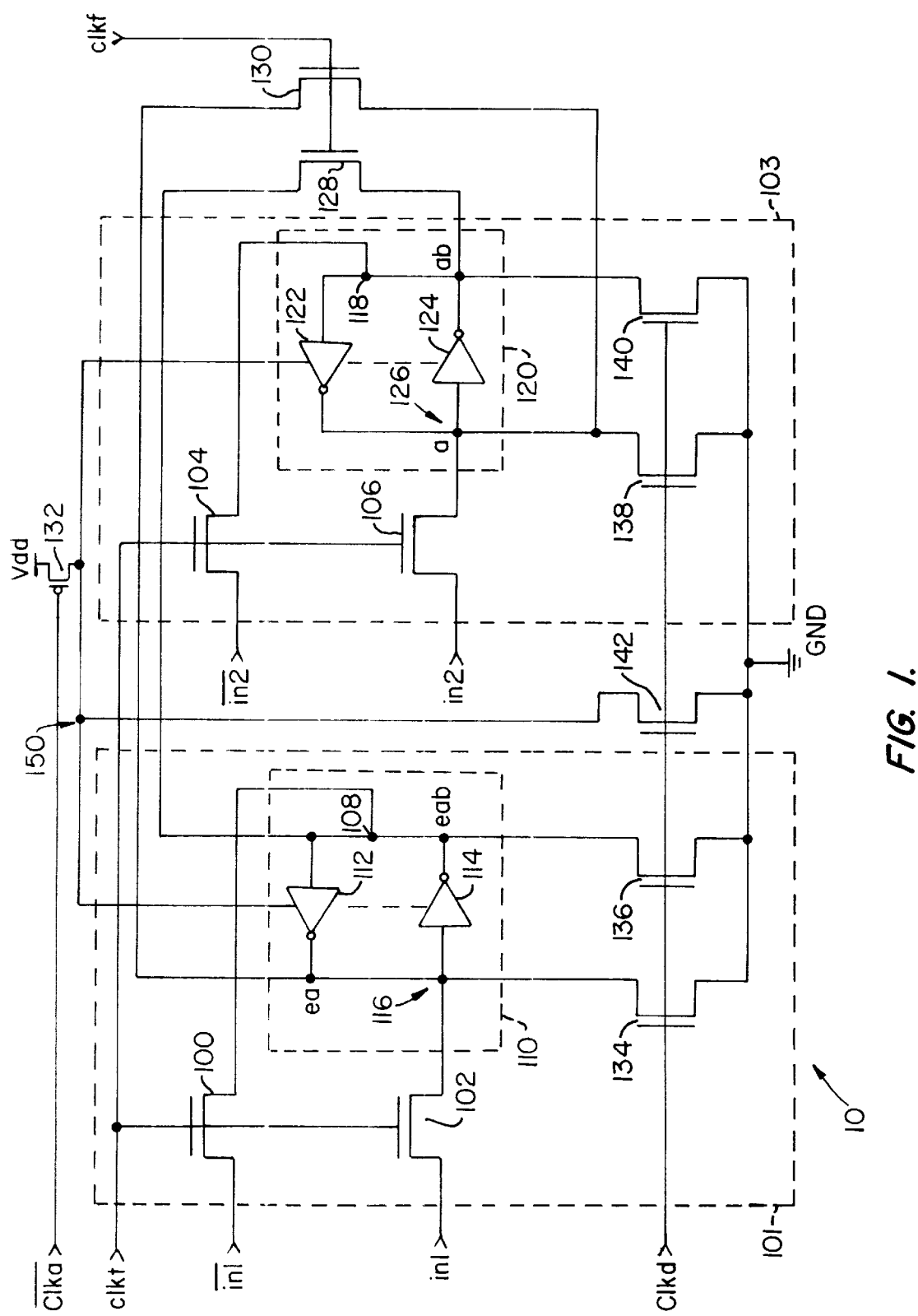
FIG. 1 shows an exemplary sense amplifier 10 according to an embodiment of the present invention.

FIG. 1 shows a sense amplifier 10 according to an embodiment of the present invention. Sense amplifier 10 is configured to accept a first differential analog input signal (in1,$\overline{in1}$) at the drains of NMOS pass transistors 100 and 102 and a second differential analog input signal (in2,$\overline{in2}$) at the drains of NMOS pass transistors 104 and 106. The source of pass transistor 100 is coupled to a first node 108 of a first regenerative amplifier block (RAB) 110, which comprises a first inverter 112 having an input and an output coupled to an output and an input of a second inverter 114, respectively. The source of pass transistor 102 is coupled to a second node 116 of RAB 110. Pass transistors 100 and 102 are controlled by a tracking clock, clkt, which is coupled to the gates of pass transistors 100 and 102. The source of pass transistor 104 is coupled to a third node 118 of a second regenerative amplifier block (RAB) 120, which comprises a third inverter 122 having an input and an output coupled to an output and an input of a fourth inverter 124, respectively. The source of pass transistor 106 is coupled to a fourth node 126 of second RAB 120. Pass transistors 104 and 106 are controlled by tracking clock, clkt, which is coupled to the gates of pass transistors 104 and 106. The gates of transistors 128 and 130 are coupled to and controlled by fuse clock, clkf, and, as will be described in more detail below, operate to respectively fuse the voltages, ab and eab, held on nodes 108 and 118 and the voltages, a and ea, held on nodes 116 and 126 following a tracking phase. Inverters 112, 114, 120 and 122 are selectively powered by a power supply voltage, Vdd, via PMOS transistor 132, which is controlled by an amplification clock, $\overline{clka}$. And, RABs 110 and 120 are selectively discharged and equalized to ground potential via transistors 134–140, which are controlled by a discharge clock, clkd.

Figure 2:
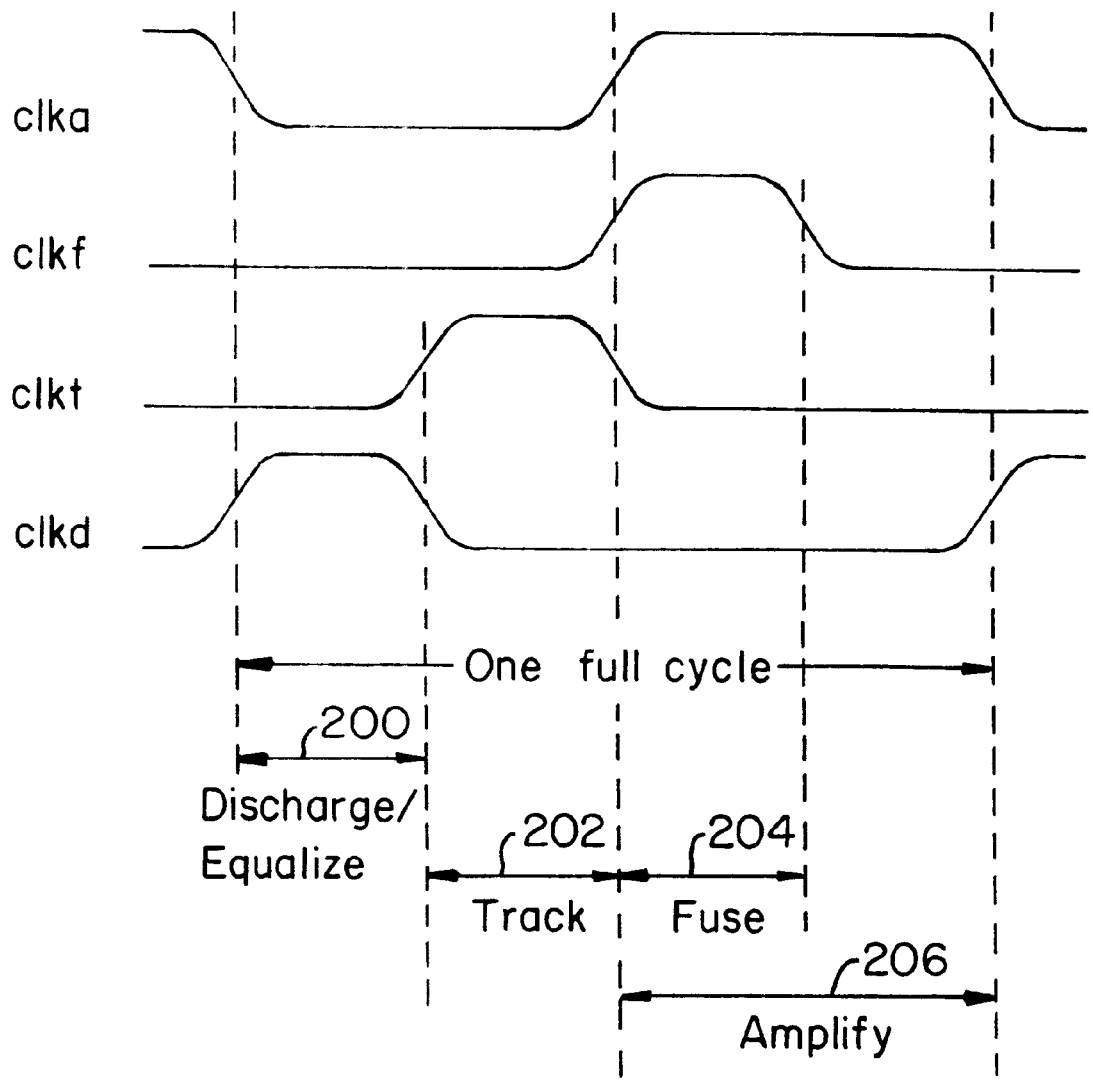
FIG. 2 shows an exemplary timing diagram, illustrating timing events associated with the operation of the sense amplifier shown in FIG. 1.

Referring now to FIG. 2, there is shown an exemplary timing diagram, illustrating timing events associated with the operation of sense amplifier 10 in FIG. 1. As shown, one full cycle of operation comprises a discharge/equalize phase 200, a track phase 202, a fuse phase 204 and an amplify phase 206. During discharge/equalize phase 200, clkd rises to a high voltage level sufficient to turn on transistors 134–142. When transistors 134–142 are turned on, RABs 110 and 120 and node 150 are coupled to ground. Specifically, during this time, nodes 108 and 116 of first RAB 110 and nodes 118 and 126 of second RAB 120 are coupled to ground. This discharges any charge held on these nodes and equalizes the two nodes of each RAB to a single ground potential. Additionally, during this time node 150 is coupled to ground to ensure that inverters 112, 114, 122 and 124 are fully shut off. At the end of discharge/equalize phase 200, clkd falls to a low voltage level, thereby turning transistors 134–142 off.

In the next cycle phase, i.e. track phase 202, tracking clock, clkt, rises to a high voltage level sufficient to turn on pass transistors 100–106. When pass transistors 100–106 are turned on, first differential analog input signal (in1,$\overline{in1}$) is passed to first 108 and second 116 nodes of first RAB 110. Similarly, second differential analog input signal (in2,$\overline{in2}$) is passed to third 118 and fourth 126 nodes of second RAB 120. Preferably, the sense amplifier in this exemplary embodiment is constructed in the form of an integrated circuit. In this way, the parasitic capacitances present in first 110 and second 120 RABs can be exploited as storage elements to "hold" the voltages a, ab, ea, and eab at nodes 126, 118, 116 and 108, respectively. At the end of track phase 202, tracking clock, clkt, falls to a low voltage level, thereby turning off pass transistors 100–106 so that first (in1, $\overline{in1}$) and second (in2,$\overline{in2}$) differential analog input signals are decoupled from first 110 and second 120 RABs.

Next in the cycle is fuse phase 204. At the beginning of fuse phage 204, fusing clock, clkf, rises to a high level sufficient to turn on transistors 128 and 130. When transistor 128 is on, the voltage eab stored on node 108 is shorted to the voltage ab stored on node 118. Similarly, when transistor 130 is on, the voltage ea stored on node 116 is shorted to the voltage a stored on node 126. This "fusing" action causes the differential voltages stored on the sense amplifier parasitic capacitances of the two RABs 110 and 120 to short together to a final voltage, $V_f$.

Final voltage, $V_f$, is determined by a capacitively weighted average of the voltages stored on first 110 and second 120 RABs. For example, if first RAB 110 has a parasitic capacitance of C1 and an initial potential difference across it of V1=(ea−eab), and second RAB 120 has a parasitic capacitance of C2 and an initial potential difference across it of V2=(a−ab), then the final voltage after fusing will be;

$$V_f = \left( \frac{C1 \times V1 + C2 \times V2}{C1 + C2} \right) \quad (1)$$

In an integrated circuit implementation, the parasitic capacitances, C1 and C2, are composed of parasitic wiring capacitances, which are substantially linear, and transistor drain, source, and gate capacitances, which are also substantially linear, so long as they are appropriately biased. The transistor source/drain capacitances remain linear so long as the drain or source is biased below the forward conductance region of the transistor (Vdd+|Vtp| for a PMOS transistor, or Gnd−Vtn for an NMOS transistor). The transistor gates could experience a sharp nonlinearity at the onset of channel inversion. However, during the track 202 and fuse 204 phases, the transistors are pre-charged in the off region so that they do not exhibit this nonlinearity. For these reasons, therefore, the capacitances C1 and C2 are kept linear.

The final voltage relationship, following fuse phase 204 discussed above, is based on the conservation of charge principle and can be written more generally as follows. If each RAB has a capacitance of C and a first and second capacitance are represented by n×C and m×C, where n and m are integers designating the number of RABs, then it can be shown that:

$$V_f = \left( \frac{n}{n+m} \right) \times V1 + \left( \frac{m}{n+m} \right) \times V2 \quad (2)$$

where V1 and V2 represent the initial voltages across nC and mC, respectively. (Because the capacitances are parasitic, each RAB can be replicated to obtain a precise value of C in the layout structure.) When fuse phase 204 is initiated, charges stored on the parasitic capacitances of the two halves of the sense amplifier are redistributed so that the initial voltages, V1 and V2, eventually become equal to the final voltage, $V_f$.

Equation (2) shows that various weights can be applied to achieve a desired linear weighting. For example, if a 0.666/0.333 weighting is needed for a particular application, the RAB is copied and duplicated so that n=2, m=1 and a 1:2 ratio is achieved. Similarly, a 0.75/0.25 weighting can provide a 1:3 ratio. And, in general, any n:m ratio can be used to achieve n/(n+m) and m/(n+m) weights.

Referring again to FIG. 2, at the time fuse phase 204 is initiated, so too may amplify phase 206 by asserting the amplification clock, $\overline{clka}$, low to turn on transistor 132. When transistor 132 is turned on, the power supply voltage, Vdd, is supplied to both RAB 110 and RAB 120. During this time, a regenerative feedback action of first regenerative amplifier block 110 allows voltages, ea and eab, at first 108 and second 116 nodes, respectively, to settle to a steady state. Similarly, during this time, a regenerative feedback action of second regenerative amplifier block 120 allows voltages, a and ab, at third 118 and fourth 126 nodes, respectively, to settle to a steady state.

If amplify phase 206 is initiated at the same time fuse phase 204 commences, transistors 128 and 130 remain on. Maintaining transistors 128 and 130 on relaxes the requirement on the speed at which fusing is accomplished. Once the fusing process has completed, the two RABs 110 and 120 work together as a single sense amplifier circuit, which amplifies the fused voltage to a final voltage, $V_f$.

$V_f$ represents a differential binary high or low voltage. The logical value of the differential binary signal depends on the two differential input voltages and the linear weighting values. Note that when amplification is turned on, some of the transistor gates, which contribute to C1 and C2, experience a sharp nonlinearity due to channel formation. However, by this time the voltages V1 and V2 have been shorted during the fuse operation. Accordingly, the nonlinearity attributable to channel formation does not affect the differential hi/lo state of the signal to be amplified and, therefore, does not contribute any error. Also, the amplification may experience a delayed onset since the internal voltages of the sense amplifier must charge up or down to the common mode voltage of the amplifier in order to enter the high gain region. This can be used advantageously to reduce the number of clocking signals needed by the sense amplifier. For example, the amplify and fuse clocks, $\overline{clka}$ and clkf, can be identical if it is always the case that the amplification takes longer to begin than the time it takes to fuse the two voltages. As a specific example, if the RC exponential decay time associated with the fuse phase is $\tau$, then a $4\tau$ delay time would be sufficient to accomplish approximately >95% of the shorting function. Depending on the needs of a particular application, more or less time margin can be given to fuse phase 204.

At the end of amplify phase 206, the amplification paths of sense amplifier 10 can be turned off and the fusing function can be terminated prior to entering a subsequent track phase 204. Alternatively, if the input signals are too sensitive to handle the function of absorbing the charge from the previous amplified voltage, then a short equilibration phase can be used prior to the next track phase in order to remove the amplified voltages and present the input signal with a consistent threshold (zero) level voltage. The equilibration function, therefore, removes any data dependent charges that would act like data dependent switched capacitors, or at lower frequencies, like data dependent resistors. The equilibrated level still acts like a switched capacitor resistance; however, it is not data dependent and introduces much less noise onto a signal path. Additionally, the equilibrated level could be to the common-mode level of (in1,$\overline{in1}$) and (in2,$\overline{in2}$) to further reduce noise.

Figure 3:
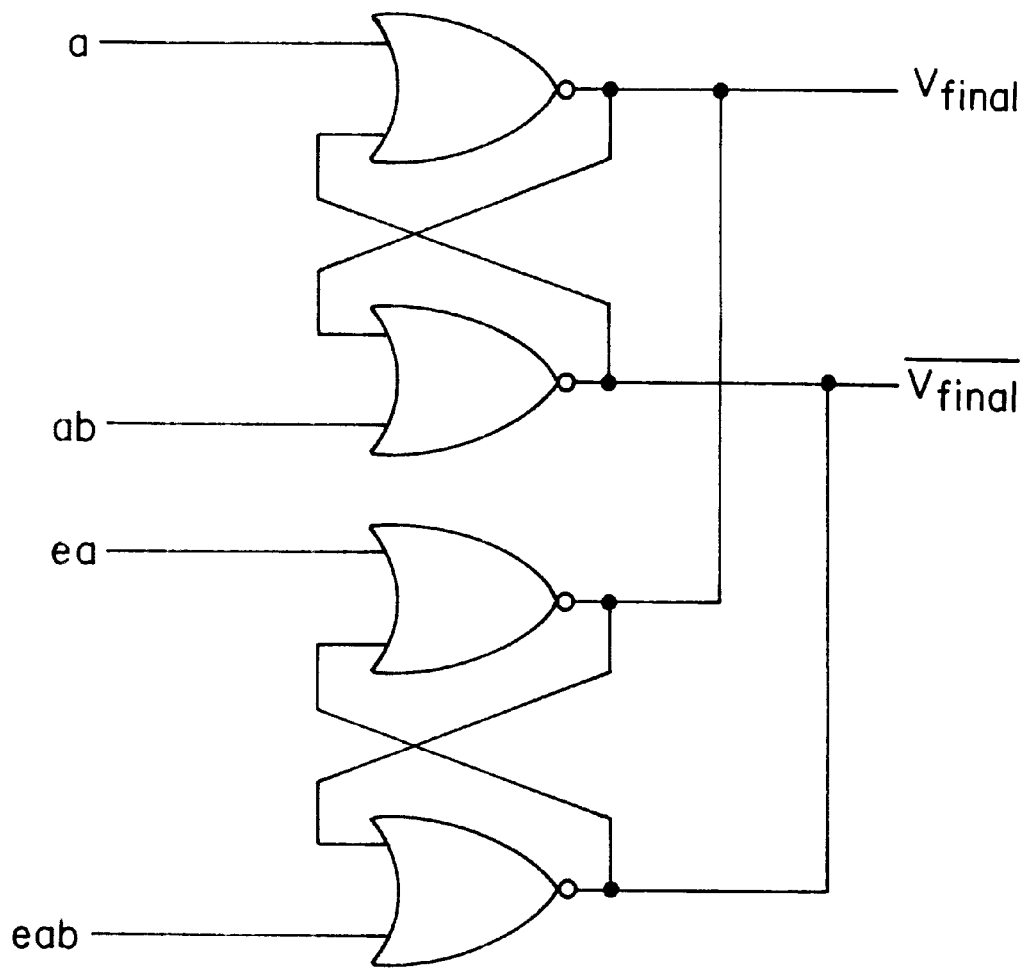
FIG. 3 shows a pair of SR latches which can be used to read the values out of the sense amplifier shown in FIG. 1.

To read the values out of sense amplifier 10 a first SR latch may be coupled across nodes a and ab of RAB 110 and a second SR latch may be coupled across nodes ea and eab of RAB 120. This implementation is shown in FIG. 3. Employment of the SR latches can assist in relaxing timing constraints associated with subsequent circuits coupled to the sense amplifier 10. If the voltages during discharge/equalize 200, track 202 and/or fuse 204 phases might inadvertently cause either of the SR latches to flip state, then the inputs to the SR latches can be gated so that they can only become active during amplify phase 206 when the amplification has began producing correct output states.

Figure 4:
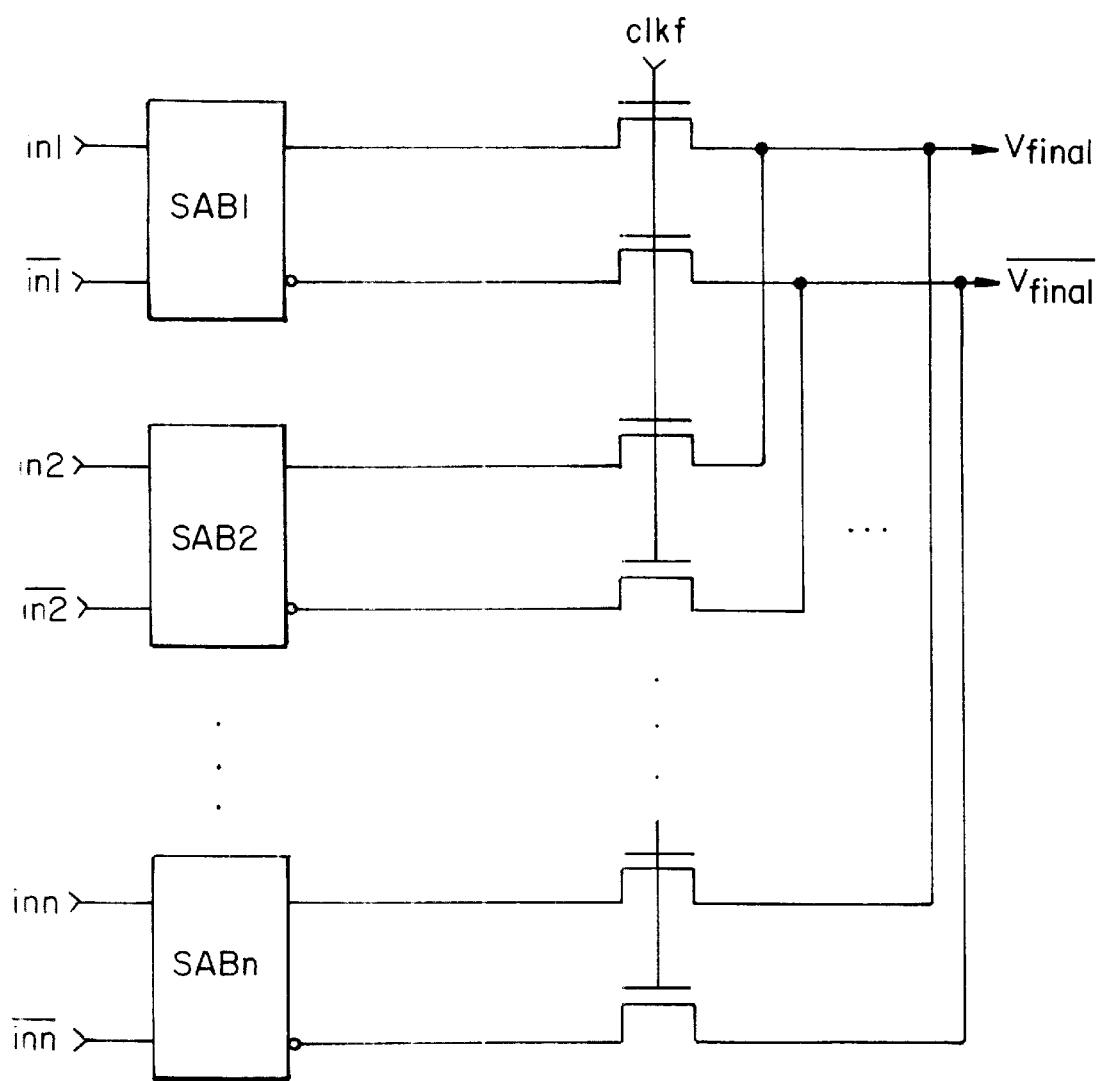
FIG. 4 shows a plurality of sense amplifier blocks (SABs), which are configured to accept a corresponding plurality of analog differential signals, according to an embodiment of the present invention.

The sense amplifier 10 shown in FIG. 1 has two sense amplifier blocks (SABs) 101 and 103, each of which comprises RABs 110 and 120 and associated tracking and discharge/equalizer circuitry. While just two SABs are depicted, the sense amplifier aspect of the present invention can be further generalized to comprise a plurality of SABs, e.g. SAB1, SAB2 ... SABn (n≧2), which are configured to accept a corresponding plurality of analog differential signals, e.g. (in1,$\overline{in1}$),(in2,$\overline{in2}$)... (inn,$\overline{inn}$), where (n≧2). This embodiment is shown in FIG. 4 where the fusing operation is controlled by a single fuse clock, clkf, provided to the gates of the nmos pass transistors.

The fusing circuit and the n:m ratio of the SABs in FIGS. 1 and 3 are shown to be statically set so that one specific set of linear weights is achieved. However, in an alternative embodiment, the fusing operation can be dynamically controlled by, for example, using more than one fusing clock, clkf, to control appropriately connected pass transistors. This would allow the dynamic connection of a first predetermined number of SABs at a first time, a second predetermined SABs at a second later time and so on. In this way the weights of the sense amplifier can be dynamically changed on, for example, a cycle by cycle basis.

Figure 5:
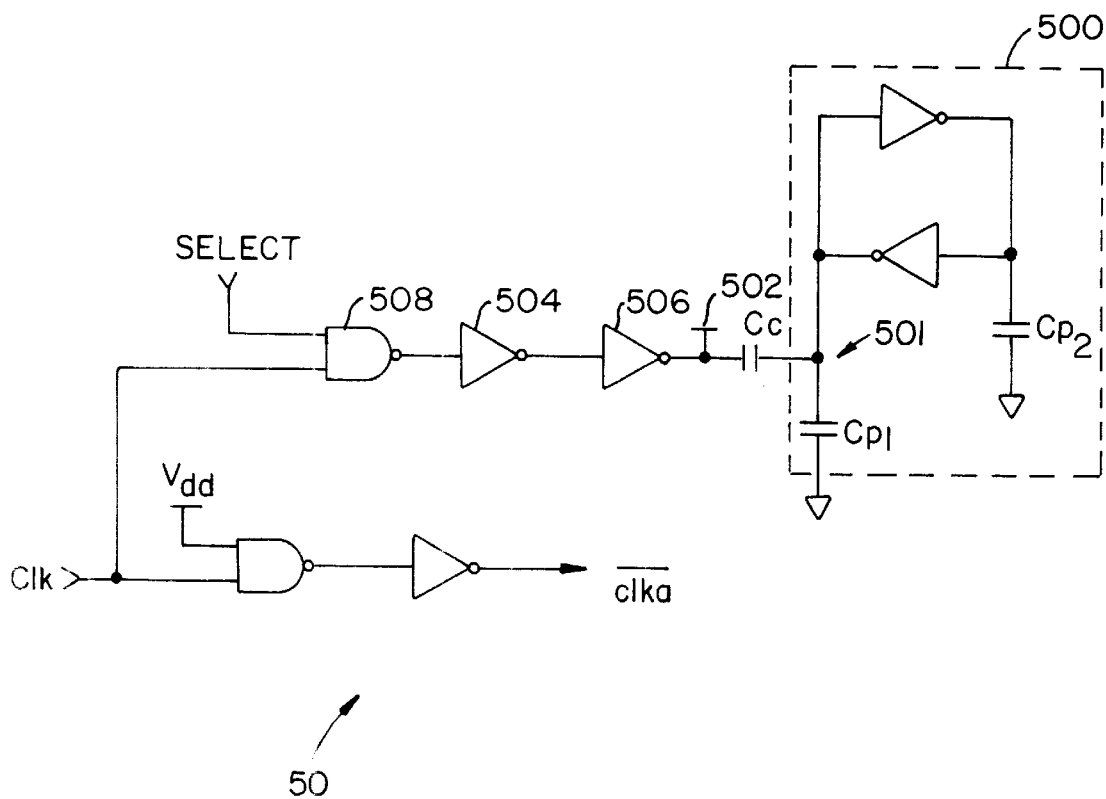
FIG. 5 shows an exemplary input offset voltage cancellation circuit, which may be used to reduce input offset voltages for the differential regenerative amplifier blocks (RABs), according to an embodiment of the present invention.

Referring now to FIG. 5, there is shown an exemplary input offset voltage cancellation circuit 50 according to an embodiment of the present invention. Input offset voltage cancellation circuit 50 may be used to reduce input offset voltages for the differential RABs described above. Input offset voltage cancellation circuit 50 comprises a coupling capacitor, Cc, having a first end coupled to one end 501 of an RAB 500. A clock driving signal, clk, for amplification clock, clka, is gated to a second end (node 502) of coupling capacitor, Cc, via inverters 504 and 506, which functions as a buffer to the gated clock driving signal, clk. Input offset cancellation circuit 50 is digitally selectable in that the gating of clock driving signal, clk, is controlled by a "SELECT" signal.

When the SELECT signal is at a low logic level (e.g ground), the NAND logic gate 508 disables the gating of clock driving signal, clk. However, if the SELECT signal is at a high logic level (e.g. Vdd) and the clock driving signal, clk, transitions from a high-to-low logic level, the output of NAND logic gate 508 and, consequently, the buffered signal at node 502, experiences a low-to-high transition. Timing of the SELECT signal is controlled so that the gated clock driving signal, clk, has a high-to-low transition after the track phase 202 of the sense amplifier has ended, but before appreciable amplification occurs during amplify phase 206 (e.g. some time during the fuse phase 204 is suitable). (See FIG. 2.) Accordingly, when the SELECT signal is asserted high, the low-to-high transition experienced at node 502 causes charge to be transferred through coupling capacitor Cc to the input 501 of RAB 500. Hence, the charge transfer and the presence of capacitor, $C_{p1}$ (which, in an integrated circuit solution is a parasitic capacitance associated with RAB 500) causes a voltage step to occur at the input 501 to RAB 500. The magnitude of this voltage step is determined by the capacitor divider formed between capacitors Cc and $C_{p1}$, i.e., voltage step=[change in voltage at node 502]*[Cc/(Cc and $C_{p1}$)]. This voltage step can be used to compensate for a difference in input offset voltages caused by variations or mismatches in transistor dimensions which make up RAB 500.

The input offset voltage cancellation circuit 50 in FIG. 5 can be further refined so that different input offset correction voltages can be selected. This can be accomplished by having multiple gated clock signals selectively coupled to different values of Cc. Further, such an input offset voltage cancellation circuit can be connected to both ends of the RAB 500 so that, by selecting which coupled capacitor's clock signals are gated, different amounts of charge may be transferred to either side of the RAB. This alternative embodiment allows different voltage corrections to be applied to the RAB as needed, for example, to cancel the expected range of input offset voltages for a given application.

Figure 6:
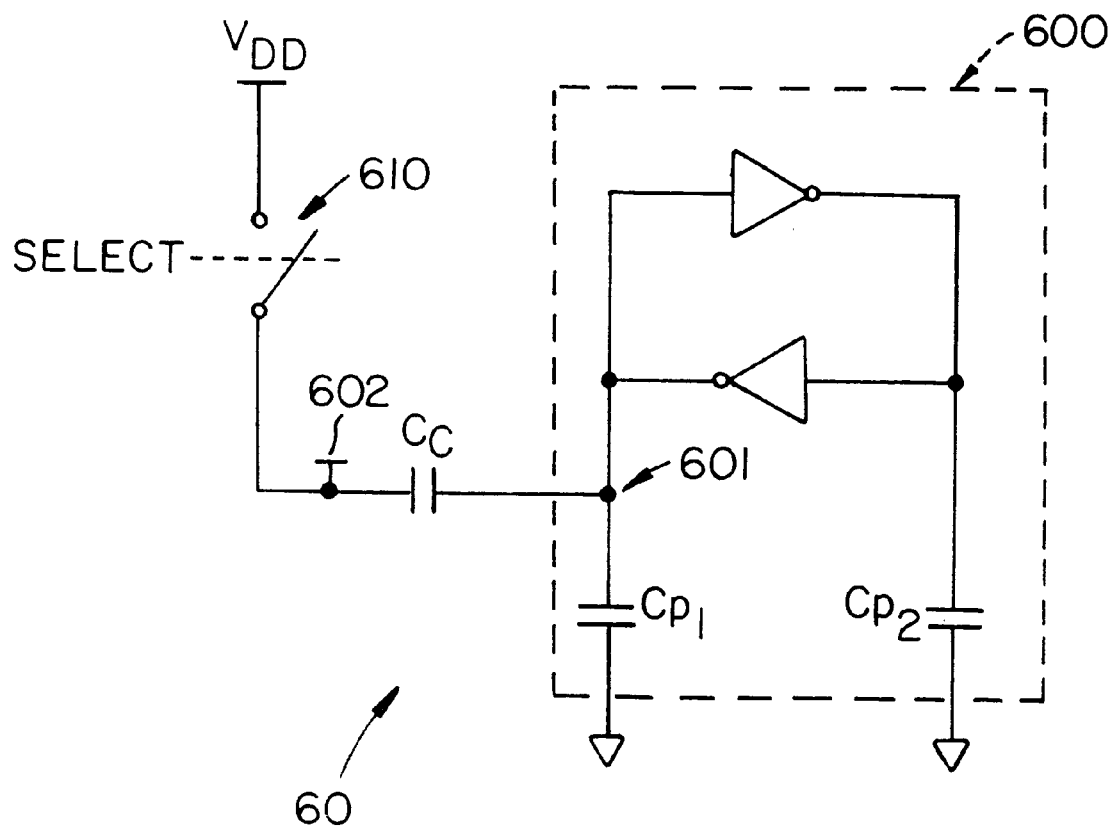
FIG. 6 shows an exemplary input offset cancellation circuit, which may be used to reduce input offset voltages for the differential regenerative amplifier blocks (RABs), according to an alternative embodiment of the present invention.

FIG. 6 shows an exemplary input offset cancellation circuit, which may be used to reduce input offset voltages for the differential regenerative amplifier blocks (RABs), according to an alternative embodiment of the present invention. An offset capacitor, Cc, has a first end coupled to one end 601 of RAB 600 and a second end coupled to isolated node 602. A select signal, "SELECT", which can be statically held on or off, controls whether switch 610 is open or closed. When switch 610 is closed, Vdd is shorted to node 602. When open, node 602 is isolated.

When node 602 is shorted to Vdd, capacitor Cc presents a capacitive load to node 601. In other words, when the voltage at node 601 increases or decreases, charge is transferred to or from capacitor Cc. However, when node 601 is isolated, capacitor Cc no longer presents a capacitive load to node 601. This is the case since no charge must be transferred to or from capacitor Cc in order for the voltage at node 601 to increase or decrease. Charge can no longer be transferred to or from capacitor Cc because isolated node 602 has broken the circuit that allows charge to transfer to or from capacitor Cc. Hence, the SELECT signal causes capacitance to be added or subtracted from one side of RAB 600.

The change in loading on one side of RAB 600 presents an imbalance, which causes an offset voltage to be created when voltages at the two nodes of the regenerative amplifier change at the start of amplification phase 206. The offset voltage is created since, at the start of amplification, the voltages on both sides of PAR 600 transition together to the high gain region of amplification. The addition of Cc (or, for example, a plurality of selectable (or non-selectable) capacitances in parallel with Cc) retards the change of voltage on that side of the sense amplifier because the general action of a capacitor is to prevent or slow changes in voltages at a node to which it is connected. As a specific example, if the RAB nodes change by 0.5 volts at the start of amplification, then the offset voltage created by connecting just Cc to the circuit would be 0.5 volts * $[C_{p2}/(Cc$ and $C_{p1})]$.

The SELECT signal does not have to be timed precisely to commencement of amplification phase 206 since it just needs to be statically held on or off. Removing the timing requirement provides an advantage compared to the embodiment shown in FIG. 5.

Although the invention has been described in terms of a preferred methods and structure, it will be obvious to those skilled in the art that many modifications and alterations may be made to the disclosed embodiments without departing from the invention. For example, a pmos transistor may be substituted for any of the nmos transistors used in the embodiments shown in FIGS. 1, 3 and 5 and 6 with only minor modifications made to the biasing and clocking schemes. Accordingly, these and other modifications and alterations are intended to be considered as within the spirit and scope of the invention as defined by the appended claims.

What is claimed is:

1. A sense amplifier, comprising:
    a first coupled set of n regenerative amplifiers having a first terminal and a second terminal configured to accept a first differential input signal, where n is an integer greater than or equal to one;
    a second coupled set of m regenerative amplifiers having a first terminal and a second terminal configured to accept a second differential input signal, where m is an integer greater than or equal to one;
    means for selectively coupling a power supply to the first and second sets so that the n and m regenerative amplifiers produce a first voltage (V1) across the first and second terminals of the n regenerative amplifiers and a second voltage (V2) across the m regenerative amplifiers; and
    a fusing circuit configured to connect the first terminal of the n regenerative amplifiers to the first terminal of the m regenerative amplifiers and to connect the second terminal of the n regenerative amplifiers to the and second terminal of the m regenerative amplifiers to produce a final differential output voltage dependent upon a fusion of the first and second differential input signals.

2. The sense amplifier of claim 1 wherein each of the regenerative amplifiers further comprises a first inverter having an input coupled to an output of a second inverter and an output coupled to an input of the second inverter.

3. The sense amplifier of claim 2 wherein each of the regenerative amplifiers includes an associated capacitor having a capacitance, C.

4. The sense amplifier of claim 3 wherein prior to fusion of the first and second voltages, the capacitors of the n regenerative amplifiers are configured to store a first charge substantially equal to n×C×V1 and the m regenerative amplifiers are configured to store a second charge substantially equal to m×C×V2.

5. The sense amplifier of claim 4 wherein the final voltage is determined by the relation (n/(n+m))×V1+(m/(n+m))×V2.

6. The sense amplifier of claim 4 wherein the sense amplifier is an integrated circuit.

7. The sense amplifier of claim 6 wherein the capacitors are parasitic capacitances of elements in the integrated circuit.

8. The sense amplifier of claim 1 wherein the final differential output voltage represents a digital logic level.

9. The sense amplifier of claim 1, further comprising:
    one or more input offset voltage cancellation circuits coupled to one or more of the regenerative amplifiers, each input offset voltage cancellation circuit comprising:
        a coupling capacitor having a first terminal coupled to a first terminal of a regenerative amplifier and a second terminal selectively coupled to a driving clock signal related to a clock for controlling the means for selectively coupling a power supply to the first and second set, the driving clock having a voltage transition at a time following fusion of the first and second voltages so as to produce a change in voltage at the first terminal of the regenerative amplifier.

10. The sense amplifier of claim 1, wherein the first and second terminals of the n regenerative amplifiers are coupled to the inputs of a first SR latch and the first and second terminals of the m regenerative amplifiers are coupled to the inputs of a second SR latch.

11. A sense amplifier, comprising:

a plurality of sense amplifier blocks configured to accept a plurality of differential input signals; and a fusing circuit selectively coupled to the plurality of sense amplifier blocks operable to fuse two or more of the plurality of differential input signals and provide a weighted output signal that is digitally representative of the two or more of the plurality of differential input signals.

12. A sense amplifier, comprising:

a first regenerative amplifier configured to selectively accept a first signal on a first regeneration node;

a second regenerative amplifier configured to selectively accept a second signal on a second regeneration node; and a fusing circuit selectively coupled to the first and second regeneration amplifiers and operable to connect the first regeneration node to the second regeneration node, when the fusing circuit is coupled, to produce a final voltage.

13. The sense amplifier of claim 12 wherein the first regenerative amplifier operates on the first signal during a track phase to produce a first voltage on the first regeneration node; and the second regenerative amplifier operates on the second signal during the track phase to produce a second voltage on the second regeneration node.

14. The sense amplifier of claim 13, further comprising:

a first capacitor having a first capacitance coupled to the first regeneration node for storing the first voltage; and a second capacitor having a second capacitance coupled to the second regeneration node for storing the second voltage.

15. The sense amplifier of claim 14 wherein the final voltage is determined by a ratio of a sum of a product of the first capacitance and the first voltage and a product of the second capacitance and the second voltage and a sum of the first and second capacitances.

16. The sense amplifier of claim 14 wherein the sense amplifier is an integrated circuit.

17. The sense amplifier of claim 16 wherein the first and second capacitors are parasitic capacitances associated with the first and second regenerative amplifiers.

18. The sense amplifier of claim 12 wherein the final voltage represents a digital logic level.

19. The sense amplifier of claim 13, further comprising an equilibration circuit operable to remove charge stored on the first and second regeneration nodes prior to the track phase.

* * * * *

UNITED STATES PATENT AND TRADEMARK OFFICE
CERTIFICATE OF CORRECTION

PATENT NO.   : 6,396,308 B1
DATED        : May 28, 2002
INVENTOR(S)  : Bosnyak et al.

It is certified that error appears in the above-identified patent and that said Letters Patent is hereby corrected as shown below:

Column 8,
Line 34, please correct claim 1 by deleting "and".

Signed and Sealed this

Twelfth Day of November, 2002

*Attest:*

*Attesting Officer*

JAMES E. ROGAN
*Director of the United States Patent and Trademark Office*